United States Patent
Ryu et al.

(10) Patent No.: US 8,139,145 B2
(45) Date of Patent: Mar. 20, 2012

(54) CAMERA MODULE

(75) Inventors: Han-Sung Ryu, Gyeonggi-do (KR);
Byoung-Rim Seo, Gyeonggi-do (KR);
Yung-Cheol Kong, Gyeonggi-do (KR)

(73) Assignee: Samsung Electronics Co., Ltd.,
Maetan-dong, Yeongtong-gu, Suwon-si,
Gyeonggi-do (KR)

( * ) Notice: Subject to any disclaimer, the term of this patent is extended or adjusted under 35 U.S.C. 154(b) by 590 days.

(21) Appl. No.: 12/262,605

(22) Filed: Oct. 31, 2008

(65) Prior Publication Data

US 2009/0115891 A1 May 7, 2009

(30) Foreign Application Priority Data

Nov. 1, 2007 (KR) .................. 10-2007-0111011

(51) Int. Cl.
*H04N 5/225* (2006.01)
*H01L 21/00* (2006.01)
(52) U.S. Cl. ......... 348/373; 348/360; 348/342; 438/118
(58) Field of Classification Search .................. 348/374, 348/373; 396/275; 257/774
See application file for complete search history.

(56) References Cited

U.S. PATENT DOCUMENTS

| | | | |
|---|---|---|---|
| 2004/0017501 A1* | 1/2004 | Asaga et al. .................. | 348/340 |
| 2006/0077281 A1 | 4/2006 | Hasegawa | |
| 2006/0114496 A1* | 6/2006 | Cho .............................. | 358/1.15 |
| 2006/0171698 A1* | 8/2006 | Ryu et al. ..................... | 396/114 |
| 2007/0228403 A1* | 10/2007 | Choi et al. ..................... | 257/98 |
| 2007/0241273 A1* | 10/2007 | Kim et al. ..................... | 250/239 |
| 2008/0267617 A1* | 10/2008 | Huang et al. .................. | 396/535 |

FOREIGN PATENT DOCUMENTS

| | | |
|---|---|---|
| JP | 2007-155800 | 6/2007 |
| KR | 2005-0087186 | 8/2005 |
| KR | 10-2005-0110901 | 11/2005 |
| KR | 10-2006-0091906 | 8/2006 |
| KR | 2007-0067898 | 6/2007 |

OTHER PUBLICATIONS

English language abstract of Korean Publication No. 2005-0087186.
English language abstract of Japanese Publication No. 2007-0067898.
English language abstract of Japanese Publication No. 2007-155800.

* cited by examiner

*Primary Examiner* — Lin Ye
*Assistant Examiner* — Mekonnen Dagnew
(74) *Attorney, Agent, or Firm* — Muir Patent Consulting, PLLC

(57) ABSTRACT

Provided is a camera module providing EMS shielding, so that electromagnetic waves generated in the camera module are prevented from radiating to the outside and external electromagnetic waves or noise are prevented from flowing into the camera module. The camera module includes: a lens unit comprising at least one lens; an image sensor package including an image sensor chip having an image area where an image is formed in response to light passing through the lens unit; a housing surrounding the lens unit and the image sensor package, wherein the housing is electrically connected to the image sensor package and is formed of a conductive material; and a connection terminal disposed below the image sensor package and electrically connecting the image sensor package and a main board of an electronic device including the camera module.

17 Claims, 7 Drawing Sheets

CAMERA MODULE

CROSS-REFERENCE TO RELATED APPLICATIONS

This application claims priority under 35 U.S.C §119 to Korean Patent Application No. 10-2007-0111011, filed on Nov. 1, 2007 in the Korean Intellectual Property Office, the disclosure of which is incorporated herein in its entirety by reference.

BACKGROUND

The present inventive concept relates to a camera module, and more particularly, to an electromagnetic compatibility (EMC) shielding camera module, which prevents electromagnetic waves generated inside the camera module from radiating to the outside, and external electromagnetic waves or noise from flowing into the camera module.

As the clock frequency of digital electronic components has increased, interference between wireless communication channels due to electromagnetic wave interactions can occur. Accordingly, a reduction of the usable frequency spectrum and a decrease in the reliability of information communication networks may result. Furthermore, the effects of electromagnetic waves on the human body and various ecosystems are increasingly relevant considerations. That is, the electromagnetic compatibility (EMC) of electronic components is becoming increasingly important. Example factors relevant to EMC are EM interference and EM susceptibility. EM interference (EMI) refers to the adverse effects of radiofrequency (RF) energy and noise radiated from a product to neighboring products. EM susceptibility (EMS) on the other hand, refers to the susceptibility of a product to RF energy, noise, or electrostatic energy generated from other products in its vicinity during operation. Hereinafter, shielding electromagnetic waves refers to minimizing EM interference and EM susceptibility (or correspondingly, maximizing EM immunity).

In particular, as many component devices are mounted inside a single digital device, for example, a mobile phone, electromagnetic waves must be shielded between the individual devices. In the case of a camera module disposed inside a mobile phone, several grounding structures have been proposed to shield electromagnetic waves between neighboring devices to the camera module. When the camera module is a socket type, the housing of the camera module is connected via a socket and thus grounding is easy. However, in the case of a camera module of a flexible print circuit board (FPCB) or a ball grid array (BGA) type, it is not easy to effectively connect the main board of the mobile phone and the housing of the camera module to each other in a small mounting space.

SUMMARY

The present inventive concept provides a camera module that effectively shields electromagnetic waves while minimizing the mounting surface area on a main board upon which the camera module is mounted.

According to an aspect of the present inventive concept, there is provided a camera module comprising: a lens unit including at least one lens; an image sensor package including an image sensor chip having an image area where an image is formed in response to light passing through the lens unit; a housing surrounding the lens unit and the image sensor package, wherein the housing is electrically connected to the image sensor package and is formed of a conductive material; and a connection terminal disposed below the image sensor package and electrically connecting the image sensor package and a main board of an electronic apparatus including the camera module.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF THE EMBODIMENTS

Figure 1:
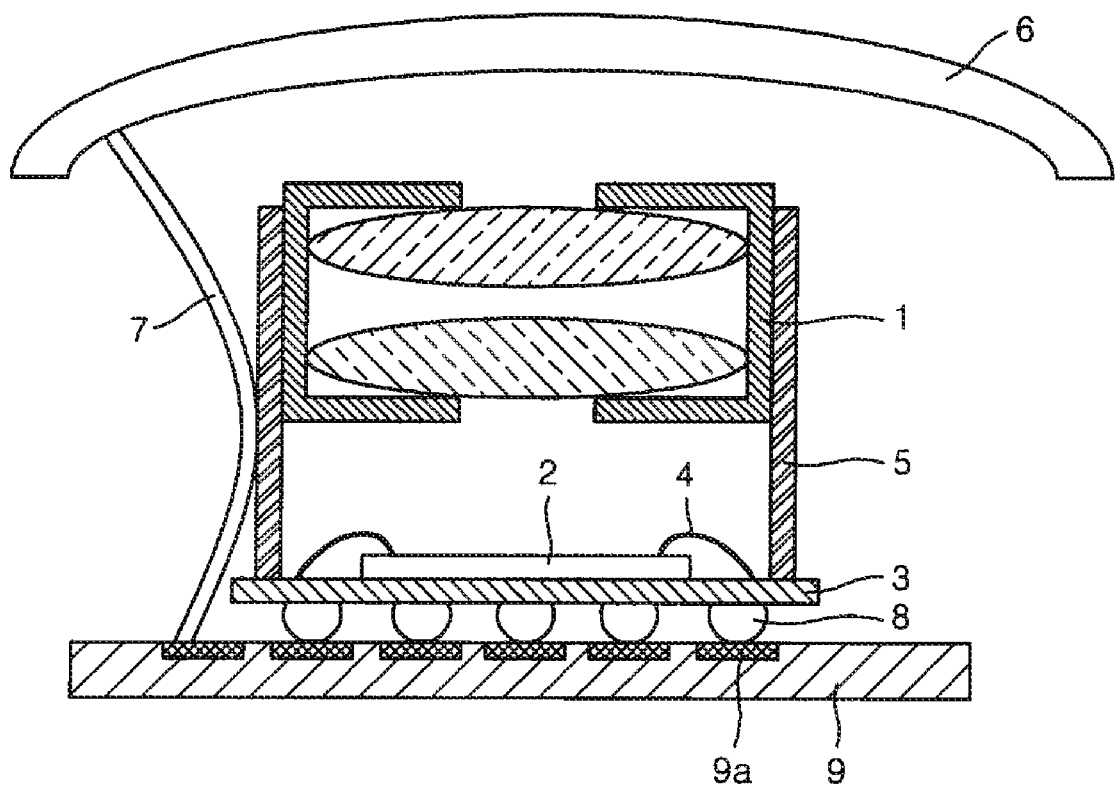
FIG. 1 is a cross-sectional view of a general camera module.

The present inventive concept will now be described more fully with reference to the accompanying drawings, in which exemplary embodiments of the inventive concept are shown. The inventive concept may, however, be embodied in many different forms and should not be construed as being limited to the embodiments set forth herein. Rather, these embodiments are provided so that this disclosure will be thorough and complete, and will fully convey the inventive concept to those skilled in the art. In the drawings, the thicknesses of layers and regions may be exaggerated for clarity.

Like reference numerals in the drawings denote like elements. Relative terms, such as "lower" or "bottom" and "upper" or "top," may be used herein to describe one element's relationship to other elements illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower," can therefore, encompass both the relationships of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both the relationships of above and below.

FIG. 1 is a cross-sectional view illustrating a general camera module. Referring to FIG. 1, the camera module includes a lens unit 1, an image sensor chip 2 comprising an image area such that an image is formed in response to light passing through the lens unit 1, a substrate 3 on a top surface of which the image sensor chip 2 is mounted, a wire 4 electrically connecting the image sensor chip 2 and the substrate 3, and a housing 5 combined with the lens unit 1. When the camera module is mounted inside a mobile phone, for example, inner walls of a mobile phone case 6 may be coated with a metal to shield electromagnetic waves. However, when only the inner walls of the mobile phone case 6 are coated with metal, electromagnetic waves may not be shielded between other component devices inside the mobile phone.

The housing 5 may be shielded from electromagnetic waves by grounding an additional external wire 7 to the inner walls of the mobile phone case 6, or a main board 9 including a grounding pad 9a. However, since lateral sides of both ends of the substrate 3 are not shielded by the housing 5, static electricity generated in the camera module may be transmitted to other component devices of the mobile phone. In this embodiment, the camera module is of a ball grid array (BGA) type; however, the camera module may also be of a flexible printed circuit board (FPCB) type.

The lens unit 1 may include a lens accommodating unit (not shown) in which at least one lens is arranged. Since various combinations of the lens unit and housing are possible, in order not to restrict the scope of the inventive concept, the various combinations of the lens unit 1 and the housing 5 are not illustrated in detail. However, an example of a lens unit and a housing in this regard is illustrated in FIGS. 2A and 2B.

Figure 2A:
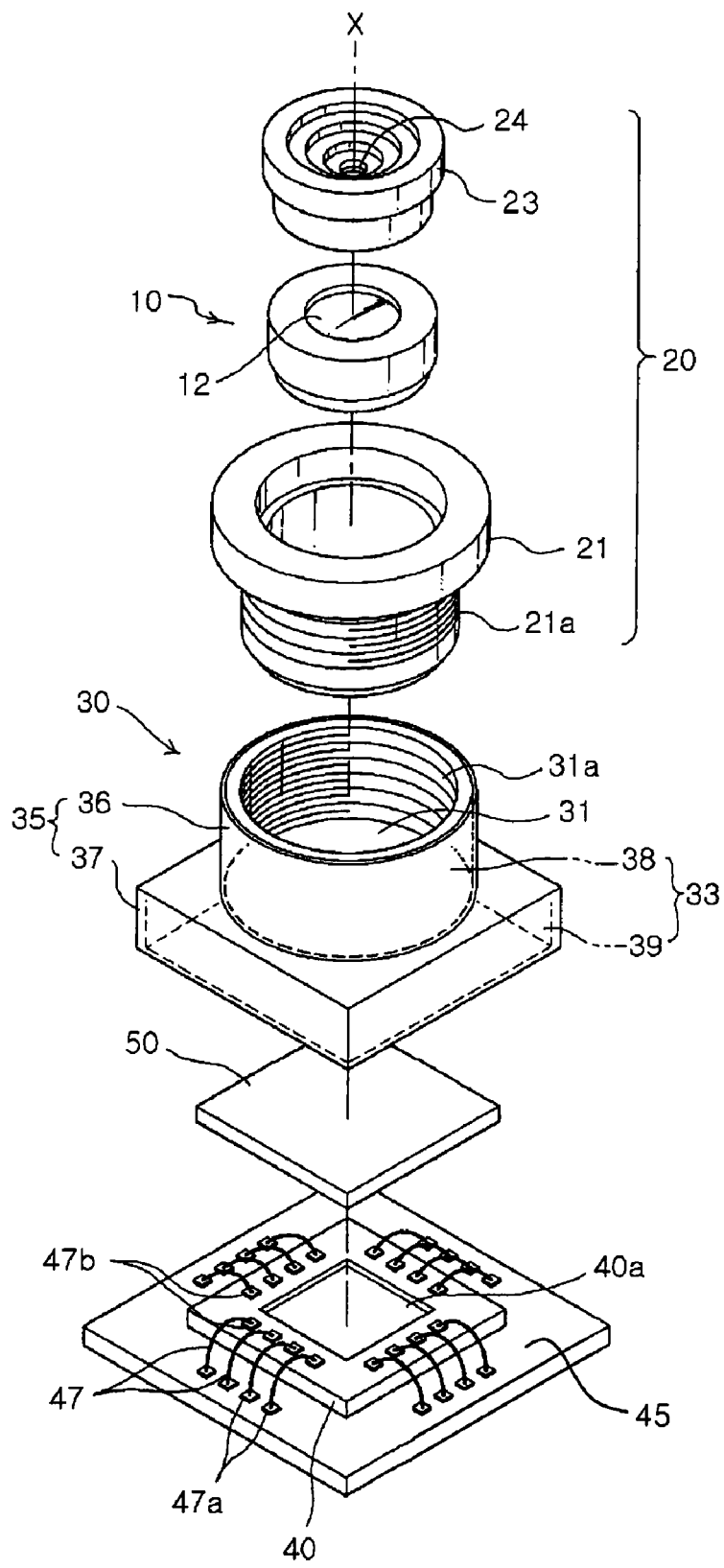
FIG. 2A is an exploded view of a general camera module.
Figure 2B:
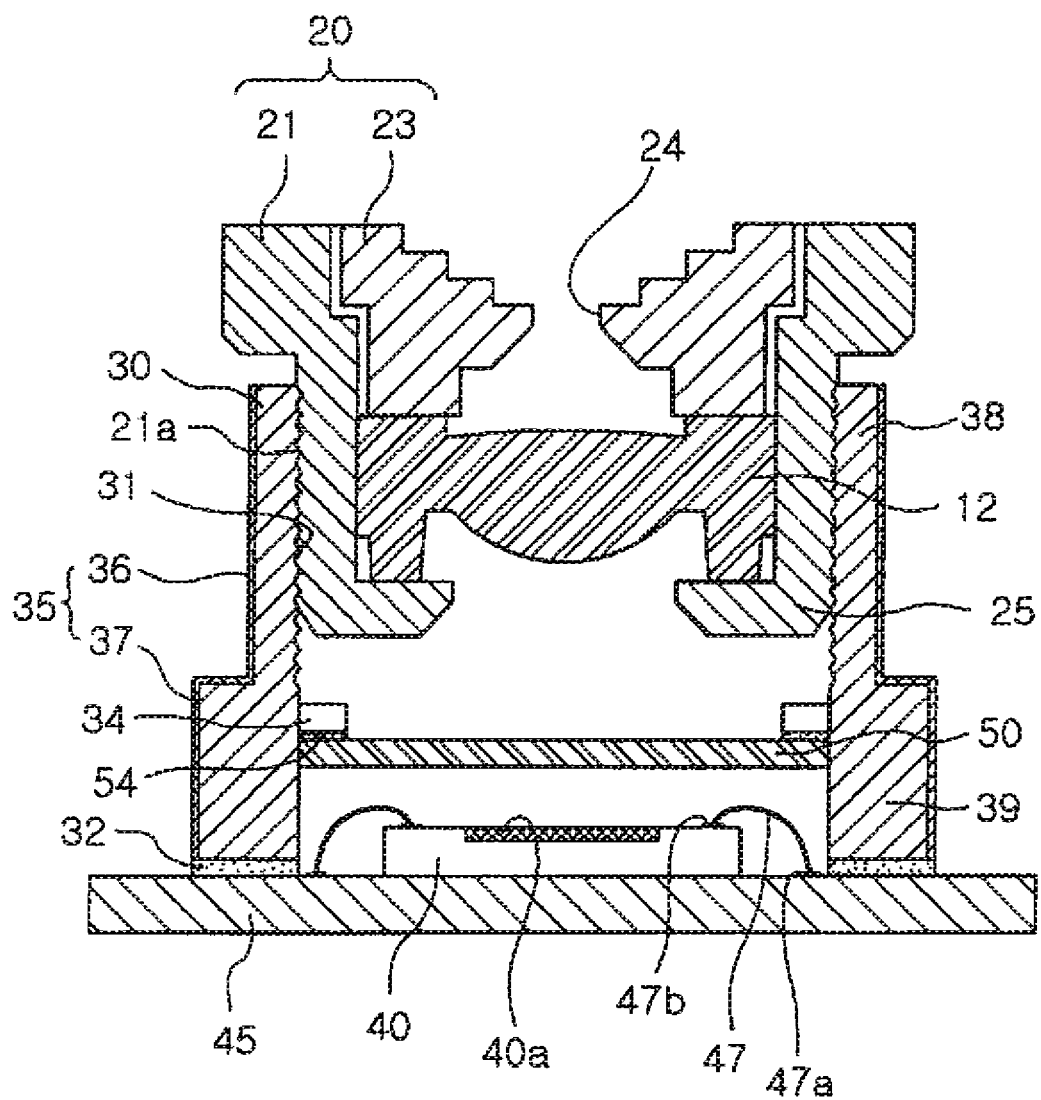
FIG. 2B is a cross-sectional view of the assembled camera module of FIG. 2A.

FIG. 2A is an exploded view of the camera module, and FIG. 2B is a cross-sectional view of the assembled camera module of FIG. 2A.

Referring to FIGS. 2A and 2B, the camera module may further include a lens group 10, a lens accommodating unit 20, a housing 30, and an image sensor 40. The lens group 10 may include at least one lens 12 arranged along an optical axis X and may be located inside the lens accommodating unit 20 having a predetermined accommodation space. When a plurality of the lenses 12 are arranged in the lens accommodating unit 20, a spacer may be placed between the lenses 12 so as to maintain a predetermined distance between the lenses 12. Also, the lens group 10 may be installed so as to have a structure in which some of the lenses can move for adjusting focus. The lens accommodating unit 20 has an incident hole 24 of a predetermined size. The incident hole 24 is formed in the front center of the lens accommodating unit 20 and its axis corresponds to the optical axis X. The lenses 12 of the lens group 10 are arranged along the optical axis X in a predetermined accommodation space, of the lens accommodating unit 20. For example, the lens accommodating unit 20 may include a hollow cylinder barrel 21, having an external screw unit 21a on an external surface thereof, and a cap 23 having the incident hole 24 in its front center to be screw-coupled to an inner surface of the barrel 21 to fix the lens group 10. The lens group 10 is arranged along the optical axis X in the body of the barrel 21. When the cap 23 is screw-coupled to an upper end of the barrel 21, a shelf 25, to which a lowermost end of the lens group 10 is contacted and supported, may be protruded from a lower end of the barrel 21. Here, the cap 23 is illustrated as screw-coupled to the upper end of the barrel 21, but the present inventive concept is not limited thereto. The cylinder barrel 21 may be screw-coupled to an internal screw unit 31a formed in an assembly hole 31 of the housing 30.

The housing 30 includes a body 33 through which an assembly hole 31 is formed so as to accommodate the lens accommodating unit 20 within, and is mounted on a top surface of a substrate 45. An internal screw portion 31a, which is screw-coupled to the external screw portion 21a of the barrel 21, may be formed in the assembly hole 31 of the body 33, so that the lens accommodating unit 20 can be movably assembled along the optical axis X. Also, the housing 30 may be mounted on the top surface of the substrate 45 using an adhesive agent 32 such as an epoxy resin. The adhesive agent 32 used to fix the housing 30 to the substrate 45 may be any well known adhesive agent, and may also be a conductive adhesive agent such as an anisotropic conductive paste (ACP) or anisotropic conductive film (ACF).

Various circuit patterns may be printed on a surface of the substrate 45, and the image sensor chip 40 may be mounted at an end portion of the substrate 45. A connector (not shown) may be formed at the other end of the substrate 45 to easily connect the image sensor chip 40 to other electronic components. An image area 40a, where an image is formed in response to light passing through the lens group 10 of the lens accommodating unit 20, may be formed on a top surface of the image sensor chip 40. The image sensor chip 40 may be a sensor unit that is electrically connected to the substrate 45, so as to convert the formed image into an electrical signal and transmit it to a display unit. The substrate 45 may be formed of a FPCB having a small board thickness, but is not limited thereto, and may also be formed of a general PCB. The image sensor chip 40 may be mounted to the substrate 45 using wire bonding, as illustrated in FIGS. 2A and 2B, such that a plurality of bonding pads 47a formed on a top surface of the substrate 45 and a plurality of bonding pads 47b formed on a top surface of the image sensor chip 40 are electrically connected via bonding wires 47. Also, an optical filter member 50, functioning to shield infrared rays from the image area 40a for example, may be mounted between the lens group 10 and the image sensor chip 40. The filter member 50 may be adhered to a fixing unit 34 formed on the inner surface of the housing 30 using an adhesive agent 54.

Figure 3:
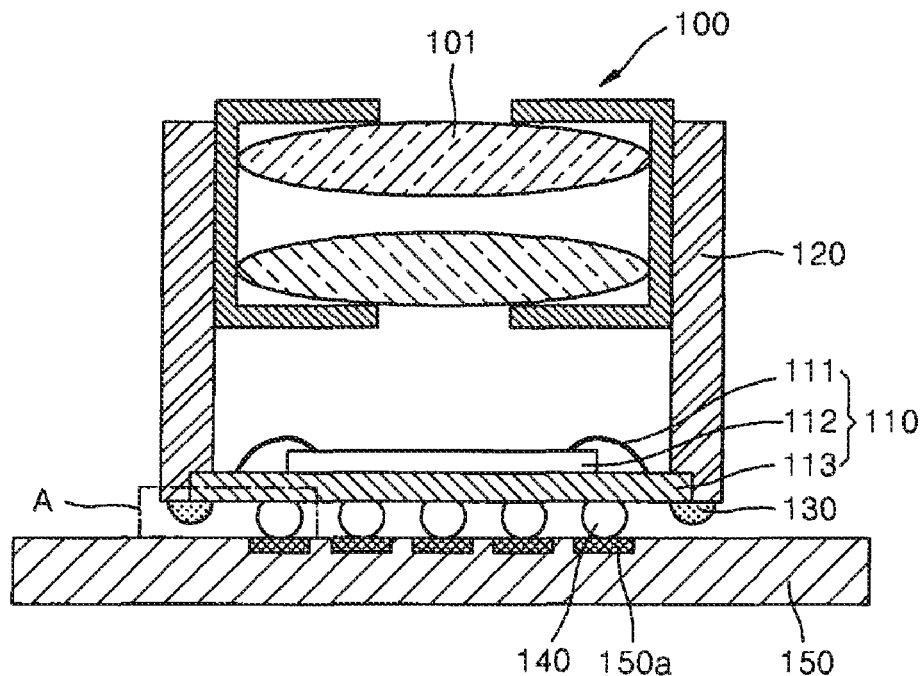
FIG. 3 is a cross-sectional view of a camera module according to an embodiment of the present inventive concept.

FIG. 3 is a cross-sectional view illustrating a camera module according to an embodiment of the present inventive concept.

Referring to FIG. 3, the camera module includes a lens unit 100 having one or more lenses 101. The lenses 101 are formed of a transparent material, and can include spherical or aspherical lenses that converge or diverge light coming from an object to form an optical image. The camera module may include a plurality of lenses 101, and each of the lenses 101 may be fixed in a barrel (not shown). Also, the lenses 101 may include plastic lenses and/or glass lenses. Plastic lenses can be mass-produced at a low cost per unit by injection molding, and thus are frequently used in modern products. Glass lenses have the advantage of providing high image resolution, but the associated manufacturing process is expensive due to complicated cutting and polishing operations. In addition, it is difficult to produce other kinds of glass lenses besides spherical or planar lenses. Various combinations of the lens unit 100 are possible according to the desired characteristics of the camera module. For example, the combination of the lens unit 100 may be as shown in FIGS. 2A and 2B, but the lens unit 100 according to the current embodiment of the present inventive concept is not limited thereto.

According to the current embodiment of the present inventive concept, the camera module further includes an image sensor package 110 having an image sensor chip 112. The image sensor chip 112 has an image area where an image is formed in response to light passing through the lens unit 100. The image sensor chip 112 receives light and converts it to an electrical signal. The image sensor chip 112 may be a chargecoupled device (CCD) sensor chip or a complementary metal oxide semiconductor (CMOS) sensor chip based on the desired application and manufacturing method of the image sensor chip.

A CCD sensor chip is based on an analog circuit, in which light entering the lens 101 is scattered to various cells, and each of the cells stores light charges. Next, the degree of light brightness is determined based on the amount of the light charges and is sent to a converter to produce color values. The CCD image sensor can clearly realize color images, but it requires a large storage capacity and consumes significant power. Therefore, the CCD image sensor is frequently used in digital cameras which require high image quality.

A CMOS sensor chip is a semiconductor chip in which circuits for processing analog signals and circuits for processing digital signals are integrated in one area. The CMOS sensor chip consumes significantly less power than the CCD sensor chip, and because the main part of the CMOS sensor chip consists of one chip, it can be used to manufacture compact products. In addition, due to recent technological developments, the CMOS sensor chip also provides high image quality in addition to the above advantages, and thus is increasingly used in various products, such as digital cameras, camera phones, and personal media players (PMP).

The image sensor package 110 also includes a first substrate 113, on a top surface of which the image sensor chip 112 is mounted, and a wire 111 electrically connecting the image sensor chip 112 and the first substrate 113. The camera module according to the current embodiment of the present inventive concept further includes a housing 120 holding lateral surfaces of the lens unit 100 and the image sensor package 110. The housing 120 may extend from lateral surfaces of the lens unit 100 to lateral surfaces of the image sensor package 110. Also, the housing 120 may surround lateral surfaces of the first substrate 113 of the image sensor package 110. In this case, as the lateral surfaces of the first substrate 113 of the image sensor package 110 are not exposed to the outside of the camera module, due to the housing 120, the image sensor package 110 can be effectively shielded from electromagnetic waves.

In FIG. 3, the housing 120 is shown as contacting top surfaces and lateral surfaces of the first substrate 113; however, the housing 120 may contact only the lateral surfaces of the first substrate 113. The housing 120 may be electrically connected to the image sensor package 110 via, for example, a conductive paste 130. The housing 120 may include a conductive material or at least an external surface of the housing 120 may be formed of a conductive material.

Specifically, the housing 120 may have a body formed of a conductive material. The conductive material may be a metal, and an insulating layer may be formed on an inner surface of the housing 120. The inner surface of the housing 120 contacts and surrounds the lens unit 100 and the image sensor package 110, while the external surface of the housing 120 is exposed outside of the camera module.

Alternatively, the housing 120 may have a body formed of an insulating material, and a conductive layer may be formed on the external surface of the body. The external surface of the body is exposed outside of the camera module. The insulating material may include a liquid crystal polymer (LCP), a polycarbonate, or a polyphenyl sulfide, and the conductive layer may contain at least one element selected from the group consisting of nickel, tin, copper, gold and silver. The housing 120 may further include a dark colored coating layer on its inner surface to minimize reflection of diffused light.

Although not illustrated in the drawings, the camera module according to the current embodiment of the present inventive concept may further include an infrared filter. As the visibility range of the human eye is 400-700 nm, and the wavelength of light that the image sensor senses is 380-1000 nm, the image sensor is more sensitive to infrared rays than the human eye. Accordingly, the infrared filter may be used to block the infrared portions of the spectrum before image information reaches the image sensor, so that color images can be properly formed.

The camera module according to the current embodiment of the present inventive concept may further include a connection terminal formed below the image sensor package 110 to electrically connect the image sensor package 110 to a main board of an electronic device or apparatus (e.g., a camera phone, digital camera, or PMP). The connection terminal may be, for example, a solder ball 140. The solder ball 140 electrically connects a first grounding pad 214 (see FIG. 5) formed on a lower surface of the image sensor package 110 and a conductive second grounding pad 150*a* formed on a top surface of a main board 150.

The main board 150 may be a printed wire board (PWB), a flexible PWB, or a rigid PWB. In general, a PWB is a circuit board in which various types of components are densely mounted on a planar plate formed of phenol resin or epoxy resin and circuits connecting the various components are formed on a surface of the planar plate. The PWB is formed by attaching a thin plate formed of, for example, copper, on one surface of a phenol resin insulation plate or epoxy resin, and etching the thin plate to form wiring patterns for circuits. The etching process includes eroding the thin plate to remove portions of the thin plate other than the circuit portions. Thus, the circuits are formed and holes for attaching and mounting components are formed in the PWB. The PWB can be a one-sided board, a double-sided board, a multi-layer board, and so forth, according to the number of wiring circuit surfaces. The larger the number of surfaces of the wiring circuits, the higher the mounting capability of the camera module, and thus the camera module can be employed in high precision products. A flexible PWB is a flexible circuit board that is manufactured as a movable circuit board or a circuit board that uses bending for inserting and mounting components. Also, a rigid flexible PWB including a rigid part and a flexible part, which are bonded to each other, may be used.

Figure 4:
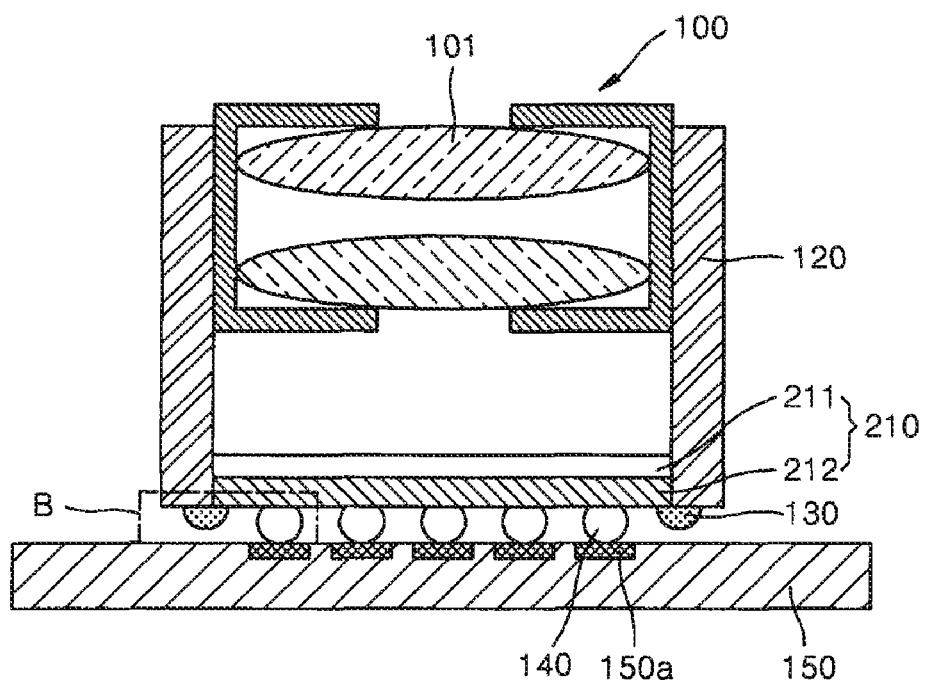
FIG. 4 is a cross-sectional view of a camera module according to another embodiment of the present inventive concept.

FIG. 4 is a cross-sectional view of a camera module according to another embodiment of the present inventive concept.

Referring to FIG. 4, the camera module comprises a lens unit 100 including one or more lenses 101. The lenses 101 are the same as, or similar to, those described above with reference to FIG. 3.

The camera module according to the current embodiment of the present inventive concept includes an image sensor package 210 having an image sensor chip 212. The image sensor chip 212 includes an image area where an image is formed in response to light passing through the lens unit 100. The image sensor package 210 may be an image sensor chip scale package (CSP).

A CSP is a newly-developed type of package, and has many advantages over a conventional image sensor plastic package. The biggest advantage of the CSP is its reduced size. According to several international semiconductor associations such as the Joint Electron Device Engineering Council (JEDEC), the Electronic Industry Association of Japan (EIAJ), etc., a CSP is a package having a size no greater than 1.2 times that of a chip. A CSP is mainly used in mobile devices, such as digital camcorders, mobile phones, and laptops, and memory cards and semiconductor devices. Various devices such as a digital signal processor (DSP), an application specific integrated circuit (ASIC), a micro controller, etc., can be mounted in a CSP. Also, a CSP in which a memory device such as a dynamic random access memory (DRAM), a flash memory, etc., is mounted can be used.

A glass layer 211 may be formed on a top surface of the image sensor chip 212. The image sensor chip 212 receives light and converts the light into an electrical signal. The image sensor chip 212 can be a CCD sensor chip or a CMOS sensor chip.

The camera module according to the current embodiment of the present inventive concept includes a housing 120 surrounding the lens unit 100 and lateral surfaces of the image sensor package 210. The housing 120 may preferably extend from lateral surfaces of the lens unit 100 to lateral surfaces of the image sensor package 210. That is, lateral surfaces of the image sensor chip 212 are not exposed to the outside due to the housing 120, and thus the image sensor package 210 can be effectively shielded from electromagnetic waves. The housing 120 may be electrically connected to the image sensor package 210 via, for example, a conductive paste 130. Also, all of the housing 120, or at least the external surface of the housing 120, may be formed of a conductive material.

Specifically, the housing 120 may include a body formed of a conductive material, such as a metal. Also, an insulating layer may be formed on an inner surface of the body. The inner surface of the body contacts and surrounds the lens unit 100 and the image sensor package 110.

Alternatively, the housing 120 may include a body formed of an insulating material and a conductive layer formed on the external surface of the body. The external surface of the body is exposed to the outside of the camera module. The insulating material may include a liquid crystal polymer (LCP), a polycarbonate, or a polyphenyl sulfide, and the conductive layer may contain at least one element selected from the group consisting of nickel, tin, copper, gold, and silver.

The camera module according to the current embodiment of the present inventive concept may further include a connection terminal that is formed below the image sensor package 210 and electrically connecting the image sensor package 210 and a main board 150 of an electronic device or apparatus (e.g., a camera phone, digital camera, or PMP). The connection terminal may be, for example, a solder ball 140. The solder ball 140 electrically connects a conductive first grounding pad 214 (see FIG. 6) formed on a lower surface of the image sensor package 210 and a conductive second grounding pad 150a that is formed on a top surface of a main board 150 of an electronic device including the camera module. The main board 150 may be a PWB, a flexible PWB, or a rigid PWB.

Figure 5:
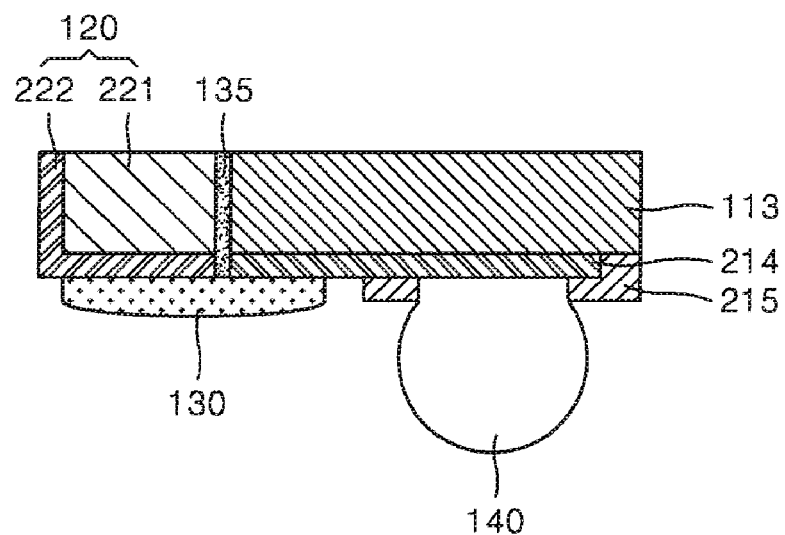
FIG. 5 is an enlarged cross-sectional view of an area of the camera module of FIG. 3.

FIG. 5 is an enlarged cross-sectional view of an area A of the camera module of FIG. 3, according to an embodiment of the present inventive concept.

In FIG. 5, an extended area A in which the housing and the image sensor package of FIG. 3 are electrically connected is illustrated. The housing 120 may be formed of a material including a conductive material. For example, the housing 120 may be formed of a body 221 including an insulating material and a conductive layer 222 formed on an external surface of the body 221. The conductive layer 222 may extend from lateral surfaces of the body 221 to a lower surface of the body 221. That is, the conductive layer 222 may not extend below the image sensor package 210. The lower surface of the image sensor package 110 illustrated in FIG. 3 is a lower surface of the first substrate 113. A conductive first grounding pad 214 is formed on the lower surface of the image sensor package 110, and the first grounding pad 214 and the housing 120 are electrically connected via the conductive paste 130. The conductive paste 130 may be a solder paste or a Ag-epoxy. The conductive paste 130 may extend from the lower surface of the housing 120 to the first grounding pad 214. If a gap is formed between the lateral surface of the image sensor package 110 and the housing 120, a non-conductive paste 135 may be filled in the gap to prevent the conductive paste 130 from filling the gap. The solder ball 140 formed below the first grounding pad 214 electrically connects the image sensor package 110 and the main board 150 in FIG. 3. The image sensor package 110 may further include a photo-solder resist (PSR) pattern 215. The housing 120, the first grounding pad 214 on the lower surface of the image sensor package 110, and a second grounding pad 150a of the main board 150 are electrically grounded due to the presence of the conductive paste 130 and the solder ball 140, thereby effectively shielding electromagnetic waves.

Figure 6:
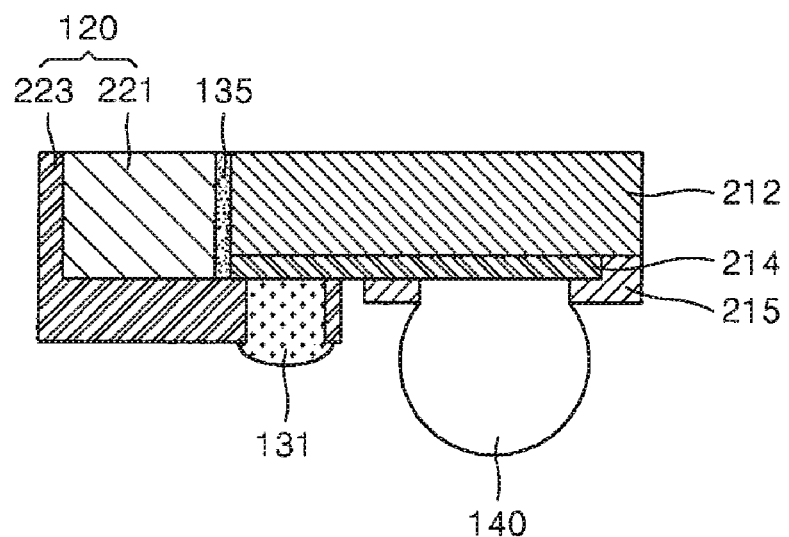
FIG. 6 is an enlarged cross-sectional view of an area of the camera module of FIG. 4.

FIG. 6 is an enlarged cross-sectional view of an area B of the camera module of FIG. 4, according to another embodiment of the present inventive concept.

In FIG. 6, an extended area B in which the housing and the image sensor package of FIG. 4 are electrically connected is illustrated. Area A in FIG. 3 corresponds to area B in FIG. 4, and thus the description about the area A of FIG. 3 may also be applied to the area B of FIG. 4. The housing 120 may be formed of a material including a conductive material. For example, the housing 120 may be formed of a body 221 including an insulating material and a conductive layer 223 formed on an external surface of the body 221. The conductive layer 223 may extend from lateral surfaces of the body 221, extending below a lower surface of image sensor package 210. The lower surface of the image sensor package 210 illustrated in FIG. 4 is the lower surface of the image sensor chip 212. Conversely, as described above, the lower surface of the image sensor package 110 illustrated in FIG. 3 is the lower surface of the first substrate 113. A conductive first grounding pad 214 is formed on the lower surface of the image sensor package 210, and the extended conductive layer 223 and the first grounding pad 214 contact each other and are electrically connected to the housing 120. The contact area of the electrical connection between the first grounding pad 214 and the housing 120 can be increased by a conductive paste 131. Alternatively, a via hole (not shown) may be formed in a portion of the conductive layer 223 formed on the lower surface of the first grounding pad 214 so as to expose the first grounding pad 214. In this case, the conductive paste 131 may fill the via hole of the conductive layer 223 exposing the first grounding pad 214 so as to increase the surface area of the electrical connection between the first grounding pad 214 and the housing 120. The conductive paste 131 may be a solder paste or a Ag-epoxy. The via hole may be formed using a general etching and/or plating method, and thus description thereof will be omitted here.

If a gap is formed between the lateral surface of the image sensor package 210 and the housing 120, a non-conductive paste 135 may be filled in the gap. The solder ball 140 formed below the first grounding pad 214 electrically connects the image sensor package 210 and the main board 150 in FIG. 4. The image sensor package 210 may further include a PSR pattern 215 on its lower surface. The housing 120 including a conductive material, the first grounding pad 214 on the lower surface of the image sensor package 210, and the second grounding pad 150a of the main board are electrically grounded due to the presence of the conductive paste 131 and the solder ball 140, thereby effectively shielding electromagnetic waves.

Figure 7:
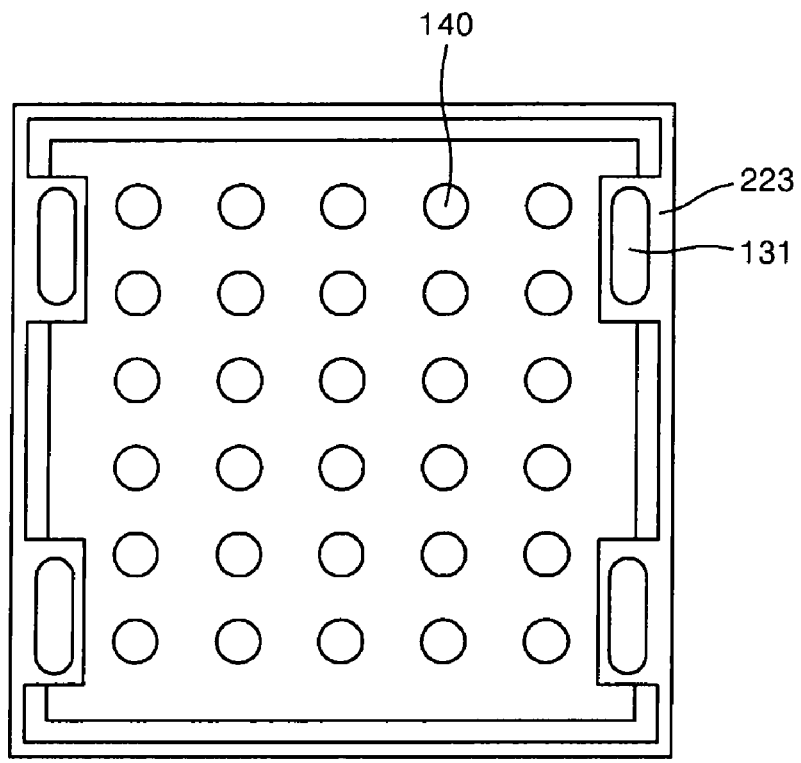
FIG. 7 is a bottom view illustrating a rear portion of the camera module of FIG. 4 including the conductive paste illustrated in FIG. 6.

FIG. 7 is a bottom view illustrating a lower portion of the camera module, including the conductive paste illustrated in FIG. 6.

Referring to FIG. 7, a plurality of connection terminals (i.e., solder balls 140) are arranged on the lower surface of the image sensor package 210. In order to electrically connect the conductive layer 223 and the image sensor package 210, the conductive paste 131 is filled in via holes of the conductive layer 223. In order not to affect the wirings of the solder balls 140 on the lower surface of the image sensor package 210 and to minimize the electrical influence on the wiring of the main board 150, the conductive layer 223 may preferably be formed only on a portion of the lower surface of the image sensor package 210. In FIG. 7, the conductive paste 131 is formed in four areas, for example. When a solder paste is used as the conductive paste 131, a reflow process may be used, and the via holes formed in the conductive layer 223 may prevent flowing of the solder paste in various undesirable directions.

Figure 8:
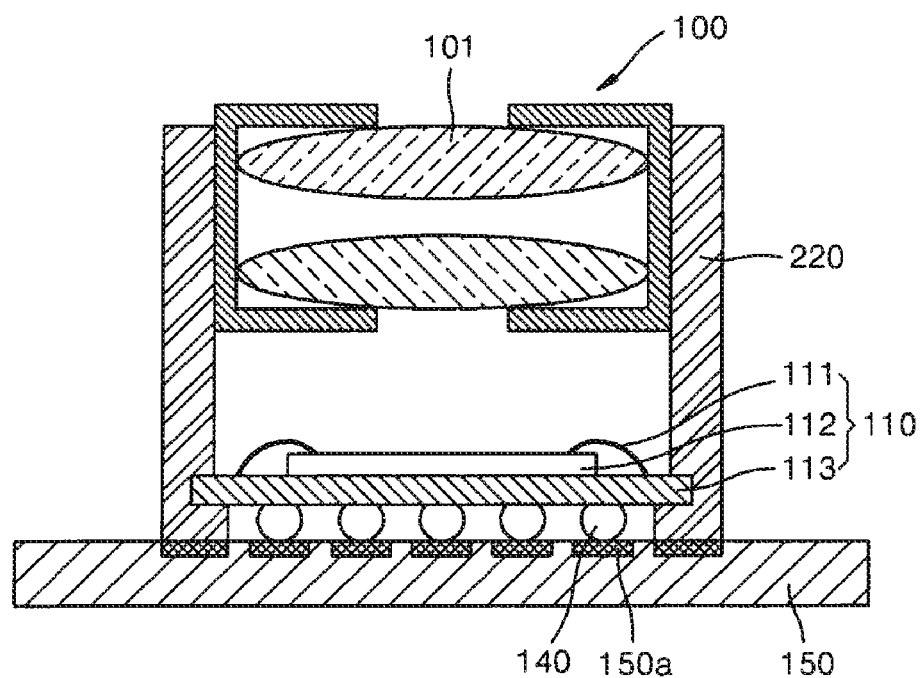
FIG. 8 is a cross-sectional view of a camera module according to another embodiment of the present inventive concept.

FIG. 8 is a cross-sectional view of a camera module according to another embodiment of the present inventive concept.

Referring to FIG. 8, the camera module according to the current embodiment of the present inventive concept includes a lens unit 100 including at least one lens 101. The lens 101 is the same as, or similar to, that described above with reference to FIG. 3. The camera module of the present embodiment includes an image sensor package 110 including an image sensor chip 112 and a first substrate 113. The image sensor chip 112 includes an image area where an image is formed in response to light passing through the lens unit 100. However, the image sensor package is not limited to the above configuration, and may also be an image sensor CSP as illustrated in FIG. 4.

The camera module of the present embodiment includes a housing 220 surrounding the lens unit 100 and lateral surfaces of the image sensor package 110. The housing 220 may extend from lateral surfaces of the lens unit 100 and the lateral surfaces of the image sensor package 110 to a main board 150. The main board 150 may include a conductive second grounding pad 150a, and the housing 220 may extend to the second grounding pad 150a. A solder paste may be formed between the housing 220 and the second grounding pad 150a, thereby reducing the electric resistance and improving the grounding effect of the electrical connection. As the lateral surfaces and the lower surface of the image sensor package 110 are not exposed to the outside of the camera module due to the housing 220, the image sensor package 110 can be effectively shielded from electromagnetic waves. Also, the housing 120 includes a conductive material. As described above, at least the external surface of the housing 120 may be formed of a conductive material.

Figure 9:
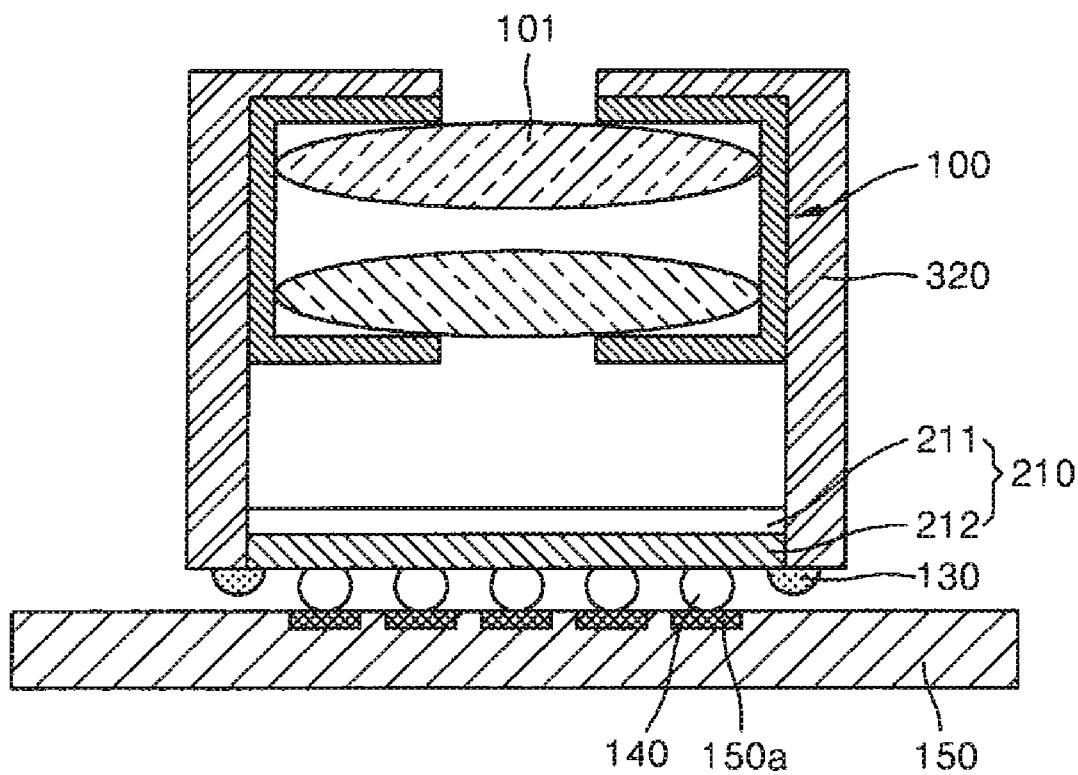
FIG. 9 is a cross-sectional view of a camera module according to still another embodiment of the present inventive concept.

FIG. 9 is a cross-sectional view of a camera module according to another embodiment of the present inventive concept.

Referring to FIG. 9, a housing 320 may extend from lateral surfaces of the image sensor package 210 and lateral surfaces of the lens unit 100 to outer portions of a top surface of the lens unit 100. The outer portions of the top surface of the lens unit 100 are portions of the lens 101 where light may not transmit. In other words, the housing 320 may cover portions of the lens unit 100 that do not transmit light to the image sensor package 210. As the housing 320 extends to the outer portion of the top surface of the lens unit 100, electromagnetic waves can be effectively shielded. The electrical connection between the housing 320 and the image sensor package 210 can be in accordance with any of the embodiments described above.

According to an aspect of the present inventive concept, there is provided a camera module comprising: a lens unit including at least one lens; an image sensor package including an image sensor chip having an image area where an image is formed in response to light passing through the lens unit; a housing substantially surrounding the lens unit and lateral surfaces of the image sensor package, wherein the housing is electrically connected to the image sensor package and includes a conductive material; and a connection terminal disposed below the image sensor package and electrically connecting the image sensor package and a main board of an electronic apparatus including the camera module.

The image sensor package may further comprise: a first substrate on a top surface of which the image sensor chip is mounted; and a wire electrically connecting the image sensor chip and the first substrate. The image sensor package may be an image sensor chip scale package (CSP). The main board may be a printed wire board (PWB), a flexible PWB, or a rigid flexible PWB.

The camera module may further comprise a conductive first grounding pad formed on a lower surface of the image sensor package, and the first grounding pad and the housing may be electrically connected via a conductive paste.

The conductive paste may extend from the lower surface of the housing to the first grounding pad. The housing may extend to an outer portion of a top surface of the lens unit through which light is not transmitted. The housing may include a body formed of a conductive material, and an inner surface of the housing may be formed of an insulating layer formed on the body.

According to another aspect of the present inventive concept, there is provided a camera comprising a housing including a body formed of an insulating material, and a conductive layer formed on an external surface of the body. The conductive layer may be formed to extend from lateral surfaces of the body to a lower surface of the body. A first conductive grounding pad may be formed on a lower surface of the image sensor package, and the conductive layer may be formed to extend from the lateral surfaces of the body to the first grounding pad, extending below a lower surface of the body, and a conductive paste may be filled in a via hole formed in the conductive layer below the first grounding pad.

According to another aspect of the present inventive concept, there is provided a camera comprising a main board further including a second conductive grounding pad, wherein a housing extends to the main board and is electrically connected to the second grounding pad.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:
1. A camera module comprising:
a lens unit comprising at least one lens;
an image sensor package including a first substrate and an image sensor chip disposed on the first substrate, the image sensor chip having an image area;
a housing surrounding the lens unit and contacting opposite lateral surfaces of the first substrate, wherein the housing is electrically connected to the image sensor package and comprises a conductive material;
a connection terminal disposed below the image sensor package and electrically connecting the image sensor package and a main board of an electronic device, and
a first grounding pad disposed on a lower surface of the first substrate, wherein the first grounding pad and the housing are electrically connected by a conductive paste.

2. The camera module of claim 1, wherein:
the first substrate includes a top surface on which the image sensor chip is mounted; and
a wire electrically connects the image sensor chip and the first substrate.

3. The camera module of claim 1, wherein the main board is a printed wire board (PWB), a flexible PWB, or a rigid flexible PWB.

4. The camera module of claim 1, wherein the connection terminal disposed below the image sensor package includes conductive balls disposed below the first grounding pad, and wherein the image sensor package and the main board are electrically connected via the conductive balls.

5. The camera module of claim 1, wherein the conductive paste is a solder paste or silver (Ag)-epoxy.

6. The camera module of claim 1, wherein the conductive paste extends from the lower surface of the housing to the first grounding pad.

7. The camera module of claim 1, further comprising a non-conductive paste disposed between a lateral surface of the image sensor package and the housing.

8. The camera module of claim 1, wherein the housing extends along a portion of a top surface of the lens unit through which light is not transmitted.

9. The camera module of claim 1, wherein the housing includes a body comprising a conductive material.

10. The camera module of claim 9, wherein an inner surface of the housing comprises an insulating layer disposed on the body.

11. The camera module of claim 1, wherein the housing includes a body comprising an insulating material and a conductive layer disposed on an external surface of the body.

12. The camera module of claim 11, wherein the insulating material includes a liquid crystal polymer (LCP), a polycarbonate, or a polyphenylsulfide.

13. The camera module of claim 11, wherein the conductive layer contains at least one element selected from the group consisting of nickel, tin, copper, gold, and silver.

14. The camera module of claim 11, wherein the conductive layer is disposed so as to extend from lateral surfaces of the body to a lower surface of the body.

15. A camera module, comprising:
a lens unit including at least one lens;
an image sensor package including an image sensor chip;
a housing substantially surrounding the lens unit and the image sensor package, wherein the housing includes a body comprising an insulating material and a conductive layer disposed on an external surface of the body;
a grounding pad disposed on a lower surface of the image sensor package, wherein the conductive layer is disposed so as to extend from lateral surfaces of the body to the first grounding pad and extend below a lower surface of the body;
a connection terminal disposed below the image sensor package and electrically connecting the grounding pad and a main board of an electronic device; and
a conductive paste disposed in a via hole in the conductive layer below the grounding pad,
wherein the grounding pad and the housing are electrically connected by a conductive paste.

16. The camera module of claim 15, further comprising a non-conductive material disposed between a lateral surface of the image sensor package and the body of the housing.

17. The camera module of claim 15, wherein the housing further comprises a coating layer disposed on an inner surface of the housing to minimize diffused reflection of light.

* * * * *